United States Patent
Byun et al.

(10) Patent No.: US 10,224,213 B2
(45) Date of Patent: Mar. 5, 2019

(54) METHOD FOR FORMING PATTERNS OF A SEMICONDUCTOR DEVICE

(71) Applicant: SAMSUNG ELECTRONICS CO., LTD., Suwon-si, Gyeonggi-do (KR)

(72) Inventors: Kyungmun Byun, Seoul (KR); Sinhae Do, Busan (KR); Badro Im, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 51 days.

(21) Appl. No.: 15/444,381

(22) Filed: Feb. 28, 2017

(65) Prior Publication Data

US 2017/0316950 A1   Nov. 2, 2017

(30) Foreign Application Priority Data

Apr. 28, 2016   (KR) .................. 10-2016-0052145

(51) Int. Cl.
| | | |
|---|---|---|
| H01L 21/308 | (2006.01) | |
| H01L 21/28 | (2006.01) | |
| H01L 21/3213 | (2006.01) | |

(52) U.S. Cl.
CPC .... *H01L 21/3086* (2013.01); *H01L 21/28017* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 6,403,996 B1 | 6/2002 | Lee | |
| 7,718,520 B2 | 5/2010 | Park | |
| 8,247,291 B2 | 8/2012 | Min et al. | |
| 8,288,825 B2 | 10/2012 | Chong et al. | |
| 8,637,407 B2 | 1/2014 | Min et al. | |
| 9,117,654 B2 * | 8/2015 | Lee ............... | H01L 21/0332 |
| 9,117,692 B2 | 8/2015 | Park et al. | |

(Continued)

FOREIGN PATENT DOCUMENTS

| | | |
|---|---|---|
| KR | 100699594 | 3/2007 |
| KR | 10-2009-0005910 | 1/2009 |
| KR | 10-2013-0023806 | 3/2013 |

*Primary Examiner* — Allan Olsen
(74) *Attorney, Agent, or Firm* — F. Chau & Associates, LLC

(57) ABSTRACT

A method for forming patterns of a semiconductor device includes sequentially forming a hard mask layer, a sacrificial layer, and an anti-reflection layer on a substrate, the substrate including a cell region and a peripheral circuit region, patterning the sacrificial layer to form a first sacrificial pattern on the cell region and a second sacrificial pattern on the peripheral circuit region, forming spacers covering sidewalls of the first and second sacrificial patterns, and removing the first sacrificial pattern. The anti-reflection layer includes a lower anti-reflection layer and an upper anti-reflection layer which are formed of materials different from each other. In the patterning of the sacrificial layer, the anti-reflection layer is patterned to form a first anti-reflection pattern on the first sacrificial pattern and a second anti-reflection pattern on the second sacrificial pattern. The second anti-reflection pattern remains when the first sacrificial pattern is removed.

16 Claims, 13 Drawing Sheets

(56) References Cited

U.S. PATENT DOCUMENTS

| | | | | |
|---|---|---|---|---|
| 9,324,570 B1* | 4/2016 | Liou | H01L 21/0337 | |
| 9,330,934 B2* | 5/2016 | Zhou | H01L 21/0337 | |
| 9,837,273 B2* | 12/2017 | Lee | H01L 21/0337 | |
| 2007/0238053 A1* | 10/2007 | Hashimoto | H01L 21/0337 | |
| | | | 430/313 | |
| 2009/0117739 A1* | 5/2009 | Shin | H01L 21/0334 | |
| | | | 438/690 | |
| 2009/0163010 A1 | 6/2009 | Oh et al. | | |
| 2010/0055914 A1* | 3/2010 | Min | H01L 21/0337 | |
| | | | 438/700 | |
| 2010/0291771 A1* | 11/2010 | Zhou | H01L 21/0337 | |
| | | | 438/710 | |
| 2011/0183505 A1* | 7/2011 | Min | H01L 21/0337 | |
| | | | 438/586 | |
| 2012/0252185 A1* | 10/2012 | Lee | H01L 21/0332 | |
| | | | 438/424 | |
| 2013/0157461 A1* | 6/2013 | Kim | H01L 21/0337 | |
| | | | 438/671 | |
| 2013/0171821 A1* | 7/2013 | Kim | H01L 21/76877 | |
| | | | 438/675 | |
| 2016/0056081 A1* | 2/2016 | Baek | H01L 29/7851 | |
| | | | 438/283 | |
| 2017/0103891 A1* | 4/2017 | Lee | H01L 21/0337 | |
| 2017/0110372 A1* | 4/2017 | Baek | H01L 21/823431 | |

* cited by examiner

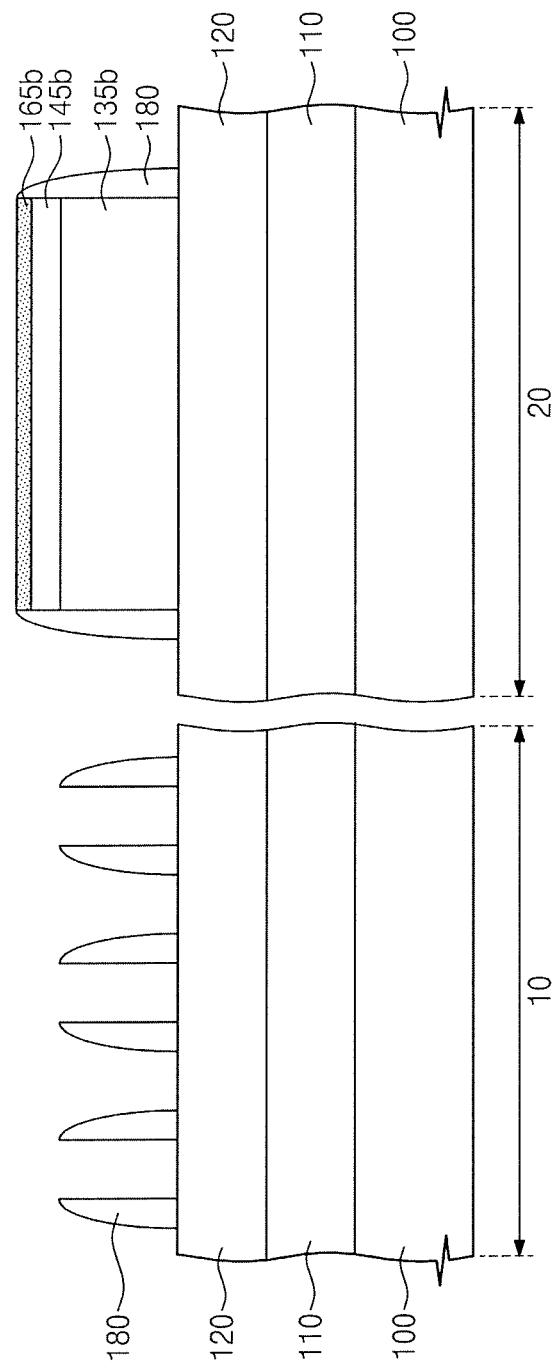

METHOD FOR FORMING PATTERNS OF A SEMICONDUCTOR DEVICE

CROSS-REFERENCE TO RELATED APPLICATION

This U.S. non-provisional patent application claims priority under 35 U.S.C. § 119 to Korean Patent Application No. 10-2016-0052145, filed on Apr. 28, 2016, in the Korean Intellectual Property Office, the disclosure of which is incorporated by reference herein in its entirety.

TECHNICAL FIELD

Exemplary embodiments of the inventive concept relate to a semiconductor device, and more particularly, to a method for forming patterns of a semiconductor device.

DISCUSSION OF THE RELATED ART

Fine patterns may be used to manufacture a highly integrated semiconductor device. To integrate a lot of elements in a small area, an individual element may be formed as small as possible. To achieve this, a pitch of desired patterns is reduced. The pitch may correspond to a sum of a width of each pattern and a distance between the patterns. However, due to a resolution limit of a photolithography process, fine pitched patterns may not be formed.

SUMMARY

In an exemplary embodiment of the inventive concept, a method for forming patterns of a semiconductor device includes sequentially forming a hard mask layer, a sacrificial layer, and an anti-reflection layer on a substrate, the substrate including a cell region and a peripheral circuit region, patterning the sacrificial layer to form a first sacrificial pattern on the cell region and a second sacrificial pattern on the peripheral circuit region, forming spacers covering sidewalls of the first and second sacrificial patterns, and removing the first sacrificial pattern. The anti-reflection layer includes a lower anti-reflection layer and an upper anti-reflection layer which are formed of materials different from each other. In the patterning of the sacrificial layer, the anti-reflection layer is patterned to form a first anti-reflection pattern on the first sacrificial pattern and a second anti-reflection pattern on the second sacrificial pattern. The second anti-reflection pattern remains when the first sacrificial pattern is removed.

In an exemplary embodiment of the inventive concept, a method for forming patterns of a semiconductor device includes sequentially forming a hard mask layer, a sacrificial layer, an anti-reflection layer, and a protection layer on a substrate, the substrate including a cell region and a peripheral circuit region, patterning the anti-reflection layer and the sacrificial layer to form a first sacrificial pattern and a first anti-reflection pattern on the cell region and to form a second sacrificial pattern and a second anti-reflection pattern on the peripheral circuit region, forming spacers covering sidewalls of the first and second sacrificial patterns, removing the first sacrificial pattern, etching the hard mask layer using the spacers of the cell region as etch masks to form first hard mask patterns, and etching the hard mask layer using the second sacrificial pattern and the spacers of the peripheral circuit region as etch masks to form a second hard mask pattern. The protection layer is etched to form a first protection pattern on the second anti-reflection pattern during the patterning of the anti-reflection layer and the sacrificial layer. The first protection pattern remains when the first sacrificial pattern is removed.

In an exemplary embodiment of the inventive concept, a method for forming patterns of a semiconductor device includes sequentially forming a first hard mask layer, a sacrificial layer, a lower anti-reflection layer and an upper anti-reflection layer on a substrate, the substrate including a cell region and a peripheral circuit region, patterning the sacrificial layer and the lower and upper anti-reflection layers to form a first sacrificial pattern on the cell region and a second sacrificial pattern on the peripheral circuit region, wherein, when patterning the sacrificial layer and the lower and upper anti-reflection layers, the upper anti-reflection layer is etched by a first degree in the cell region, and the upper anti-reflection layer is etched by a second degree, smaller than the first degree, in the peripheral circuit region to remain in the peripheral circuit region, forming a pair of first spacers on opposing sidewalls of the first sacrificial pattern and a pair of second spacers on opposing sidewalls of the second sacrificial pattern, removing the first sacrificial pattern, and patterning the first hard mask layer using the pair of first spacers, the pair of second spacers and the second sacrificial pattern to form a first mask pattern on the cell region and a second mask pattern on the peripheral circuit region.

BRIEF DESCRIPTION OF THE DRAWINGS

The inventive concept will become more apparent by describing in detail exemplary embodiments thereof in conjunction with the accompanying drawings, in which:

FIGS. 2A to 2D are cross-sectional views illustrating a method for forming patterns of a semiconductor device, according to an exemplary embodiment of the inventive concept.

DETAILED DESCRIPTION OF THE EMBODIMENTS

FIGS. 1A to 1H are cross-sectional views illustrating a method for forming patterns of a semiconductor device, according to an exemplary embodiment of the inventive concept.

Figure 1A:
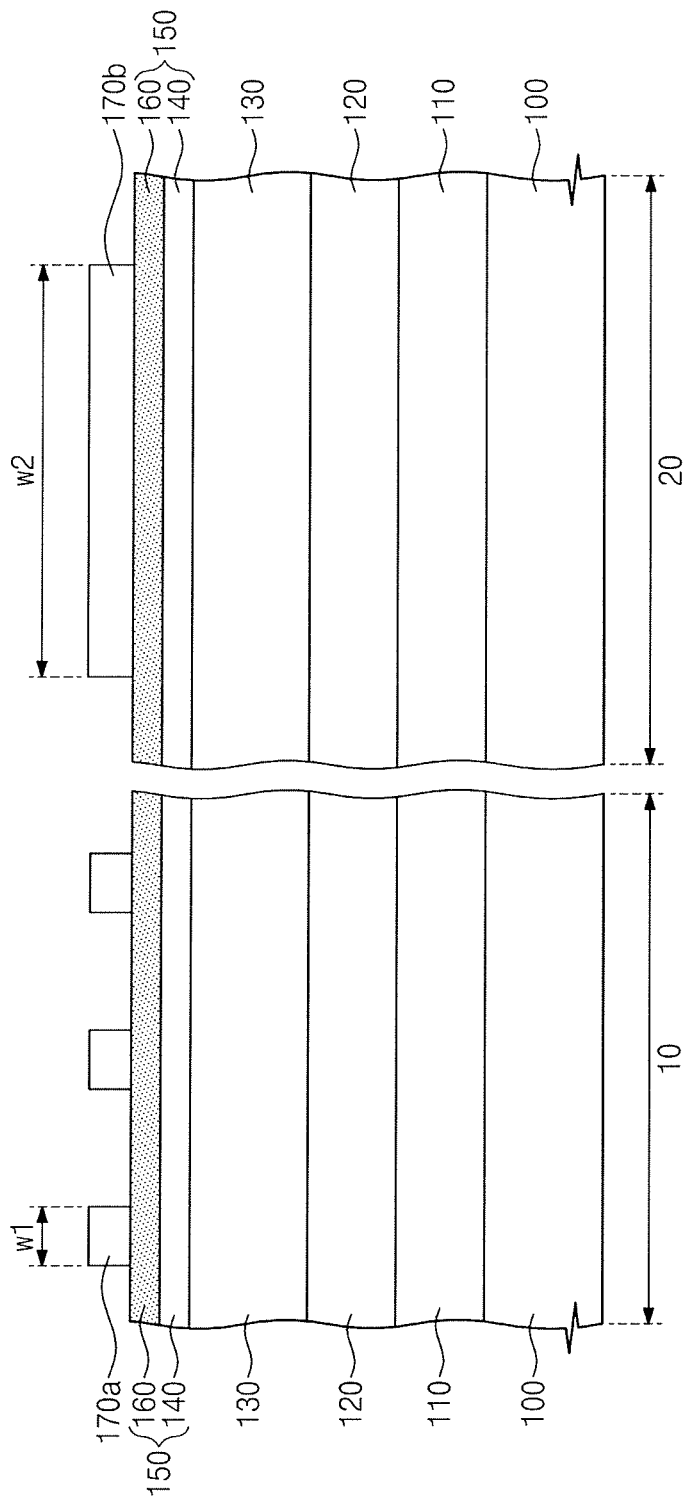
FIGS. 1A to 1H are cross-sectional views illustrating a method for forming patterns of a semiconductor device, according to an exemplary embodiment of the inventive concept.

Referring to FIG. 1A, a semiconductor substrate 100 may be provided. The semiconductor substrate 100 may include a first region 10 and a second region 20. For example, the semiconductor substrate 100 may include silicon (Si) or silicon carbide (SiC). In an exemplary embodiment of the inventive concept, the first region 10 may be a cell array region (or a cell region) on which unit memory elements are formed, and the second region 20 may be a peripheral circuit region or a core region on which peripheral circuits for driving the unit memory elements are formed. Narrow-width patterns may be formed on the first region 10, and wide-width patterns may be formed on the second region 20. In addition, a pattern density of the first region 10 may be higher than a pattern density of the second region 20.

A lower layer may be formed on the semiconductor substrate 100. The lower layer may be a conductive layer, a semiconductor layer, an insulating layer, or a stack layer. The stack layer may include a conductive layer, a semiconductor layer, and/or an insulating layer. For example, when the lower layer is a semiconductor layer, the lower layer may be a portion of the semiconductor substrate 100. For example, when the lower layer is a conductive layer, the lower layer may include doped poly-silicon, a metal silicide, a metal, a metal nitride, or a combination thereof. In this case, the lower layer may be an etch target layer for forming gate lines or bit lines. When the lower layer is an insulating layer, the lower layer may include silicon oxide, silicon nitride, silicon oxynitride and/or a low-k dielectric material having a low dielectric constant. In this case, the lower layer may be an etch target layer for forming a mask pattern which is used as an etch mask for forming patterns of a semiconductor device. In an exemplary embodiment of the inventive concept, the lower layer may include crystalline silicon, amorphous silicon, silicon doped with dopants, silicon-germanium and/or a carbon-based material.

A hard mask layer may be formed on the semiconductor substrate 100. The hard mask layer may include a lower mask layer 110 and an upper mask layer 120, which are sequentially formed on the semiconductor substrate 100. In an exemplary embodiment of the inventive concept, the hard mask layer may be a stack layer including three or more layers stacked on each other. The lower mask layer 110 may include a material having an etch selectivity with respect to the semiconductor substrate 100. For example, the lower mask layer 110 may include silicon oxide ($SiO_2$), silicon nitride (SiN), and/or silicon oxynitride (SiON). The upper mask layer 120 may include a material having an etch selectivity with respect to the lower mask layer 110. For example, the upper mask layer 120 may include poly-silicon.

A sacrificial layer 130 may be formed on the upper mask layer 120. The sacrificial layer 130 may include a material having an etch selectivity with respect to the upper mask layer 120. For example, the sacrificial layer 130 may include a carbon containing layer, a spin-on-hardmask (SOH) layer, and/or an amorphous carbon layer (ACL).

An anti-reflection layer 150 may be formed on the sacrificial layer 130. The anti-reflection layer 150 may include a lower anti-reflection layer 140 being in contact with the sacrificial layer 130, and an upper anti-reflection layer 160 formed on the lower anti-reflection layer 140. The lower anti-reflection layer 140 and the upper anti-reflection layer 160 may include materials having different etch characteristics from each other under a predetermined etch condition. For example, each of the lower and upper anti-reflection layers 140 and 160 may include a silicon oxide layer, a silicon oxynitride layer, or a nitride layer. The nitride layer may include a silicon nitride (SiN) layer, a boron nitride (BN) layer, and/or a titanium nitride (TiN) layer. The lower anti-reflection layer 140 may function as an anti-reflection layer, and the upper anti-reflection layer 160 may function as an etch stop layer.

First and second photoresist patterns 170a and 170b may be formed on the upper anti-reflection layer 160. In an exemplary embodiment of the inventive concept, the first photoresist pattern 170a may be formed on the first region 10, and the second photoresist pattern 170b may be formed on the second region 20. In an exemplary embodiment of the inventive concept, a plurality of first photoresist patterns 170a may be formed on the first region 10, and a plurality of second photoresist patterns 170b may be formed on the second region 20. In an exemplary embodiment of the inventive concept, a width W2 of the second photoresist pattern 170b may be greater than a width W1 of the first photoresist pattern 170a.

The first and second photoresist patterns 170a and 170b may be formed by using a photolithography process. For example, a photoresist layer may be formed by coating a top surface of the anti-reflection layer 150 with a photoresist material, and an exposure process and a development process may be performed on the photoresist layer to form the first and second photoresist patterns 170a and 170b. The exposure process may be performed by using a krypton fluoride (KrF) laser, an argon fluoride (ArF) laser, a fluorine ($F_2$) laser, or an extreme ultraviolet (EUV) radiation in the photolithography process.

Figure 1B:
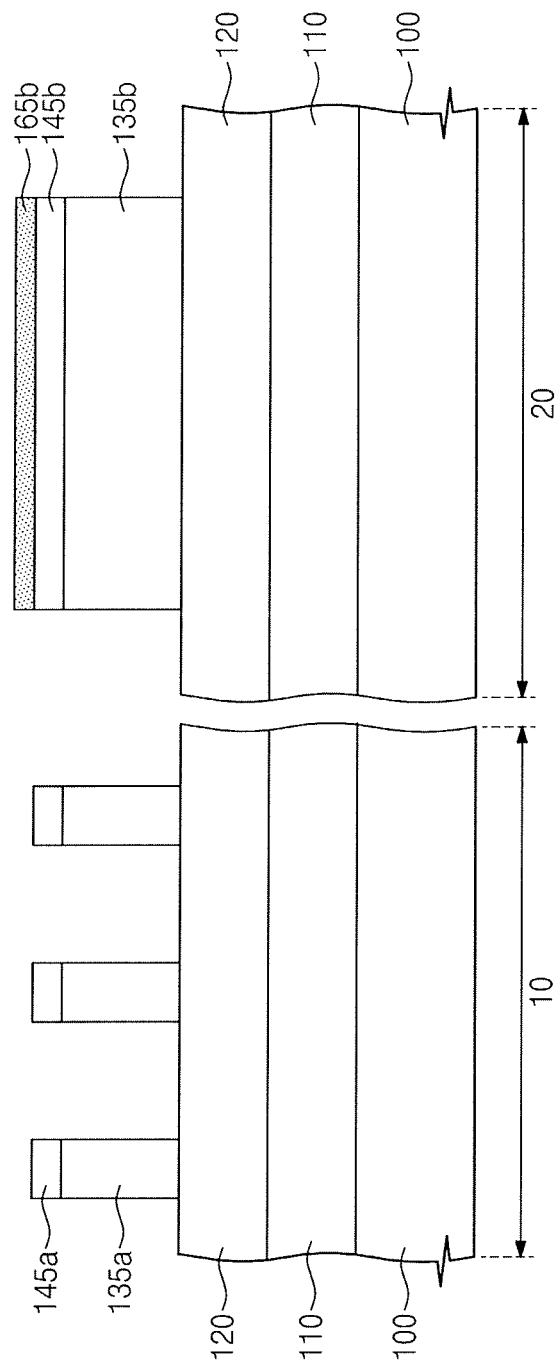

Referring to FIG. 1B, the anti-reflection layer 150 and the sacrificial layer 130 may be patterned (or etched) using the first and second photoresist patterns 170a and 170b as etch masks to form a first sacrificial pattern 135a and a first lower anti-reflection pattern 145a on the first region 10, and to form a second sacrificial pattern 135b, a second lower anti-reflection pattern 145b, and a second upper anti-reflection pattern 165b on the second region 20. The first sacrificial pattern 135a and the first lower anti-reflection pattern 145a may have widths corresponding to the width W1 of each of the first photoresist patterns 170a. The second sacrificial pattern 135b, the second lower anti-reflection pattern 145b, and the second upper anti-reflection pattern 165b may have widths corresponding to the width W2 of the second photoresist pattern 170b. The first and second photoresist patterns 170a and 170b may be removed during the process of patterning the sacrificial layer 130 and the anti-reflection layer 150.

In the etching process of the patterning process, the patterns formed on the first and second regions 10 and 20 may be affected by an etching gas in a horizontal direction, a vertical direction and an inclined direction, the horizontal, vertical and inclined directions being taken with respect to top surfaces of the patterns. Thus, the patterns formed on the first and second regions 10 and 20 may be etched in the horizontal direction, the vertical direction and the inclined direction. Since the widths of the patterns formed on the first region 10 are narrower than the widths of the patterns formed on the second region 20, an etch rate of the patterns formed on the first region 10 may be higher than an etch rate of the patterns formed on the second region 20. As a result, the etch rate of the upper anti-reflection layer 160 of the first region 10 may be higher than the etch rate of the upper anti-reflection layer 160 of the second region 20. Thus, the upper anti-reflection layer 160 of the first region 10 may be completely removed, but a portion of the upper anti-reflection layer 160 of the second region 20 may remain to form the second upper anti-reflection pattern 165b. The upper anti-reflection layer 160 of the second region 20 may also be partially etched. Accordingly, a thickness of the second upper anti-reflection pattern 165b may be smaller than a thickness of the upper anti-reflection layer 160.

Figure 1C:
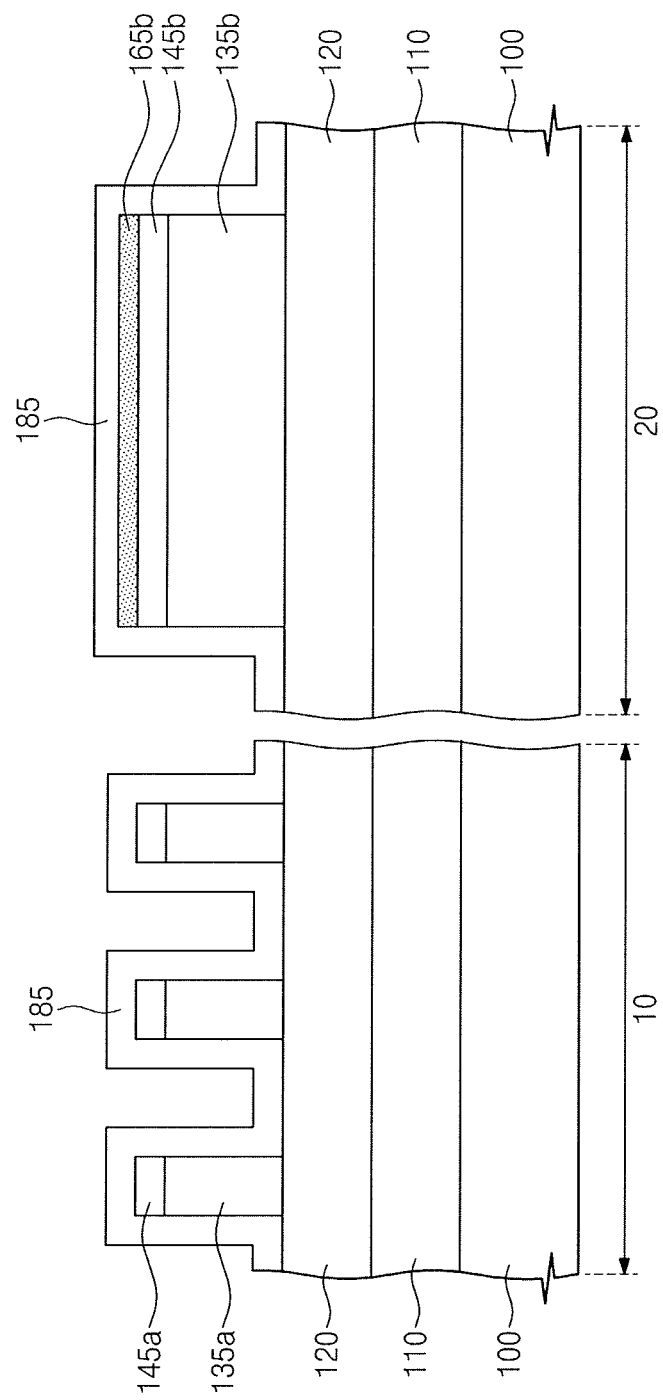

Referring to FIG. 1C, a spacer layer 185 may be formed to cover the first sacrificial pattern 135a and the first lower anti-reflection pattern 145a on the first region 10, and to cover the second sacrificial pattern 135b, the second lower anti-reflection pattern 145b, and the second upper anti-reflection pattern 165b on the second region 20. The spacer layer 185 may have a uniform thickness. The spacer layer 185 may have an etch selectivity with respect to the first and second sacrificial patterns 135a and 135b. In addition, the second upper anti-reflection pattern 165b may have an etch selectivity with respect to the spacer layer 185.

In an exemplary embodiment of the inventive concept, the spacer layer 185 may include a silicon oxide ($SiO_2$) layer such as an atomic layer deposition (ALD) oxide layer, a chemical vapor deposition (CVD) oxide layer, a high-density plasma (HDP) oxide layer, a tetraethylorthosilicate (TEOS) layer, or a plasma enhanced tetraethylorthosilicate (PE-TEOS) layer. In this case, the second upper anti-reflection pattern 165b may include a silicon nitride (SiN) layer, a boron nitride (BN) layer, or a titanium nitride (TiN) layer, and the first and second lower anti-reflection patterns 145a and 145b may include a silicon oxide ($SiO_2$) layer. Alternatively, the first and second lower anti-reflection patterns 145a and 145b may include a first silicon oxynitride ($SiO_xN_{1-x}$) layer, where "x" is equal to or greater than 0.9 and less than 1, and the second upper anti-reflection pattern 165b may include a second silicon oxynitride ($SiO_{1-y}N_y$) layer, where "y" is equal to or greater than 0.9 and less than 1. A nitrogen content in the second upper anti-reflection pattern 165b may be greater than a nitrogen content in the first and second lower anti-reflection patterns 145a and 145b.

In an exemplary embodiment of the inventive concept, the spacer layer 185 may include a silicon nitride (SiN) layer such as an ALD nitride layer, a CVD nitride layer, or an HDP nitride layer. In this case, the second upper anti-reflection pattern 165b may include a silicon oxide ($SiO_2$) layer, and the first and second lower anti-reflection patterns 145a and 145b may include a silicon nitride (SiN) layer. Alternatively, the first and second lower anti-reflection patterns 145a and 145b may include a first silicon oxynitride ($SiO_{1-x}N_x$) layer, where "x" is equal to or greater than 0.9 and less than 1, and the second upper anti-reflection pattern 165b may include a second silicon oxynitride ($SiO_yN_{1-y}$) layer, where "y" is equal to or greater than 0.9 and less than 1. An oxygen content in the second upper anti-reflection pattern 165b may be greater than an oxygen content in the first and second lower anti-reflection patterns 145a and 145b.

Figure 1D:
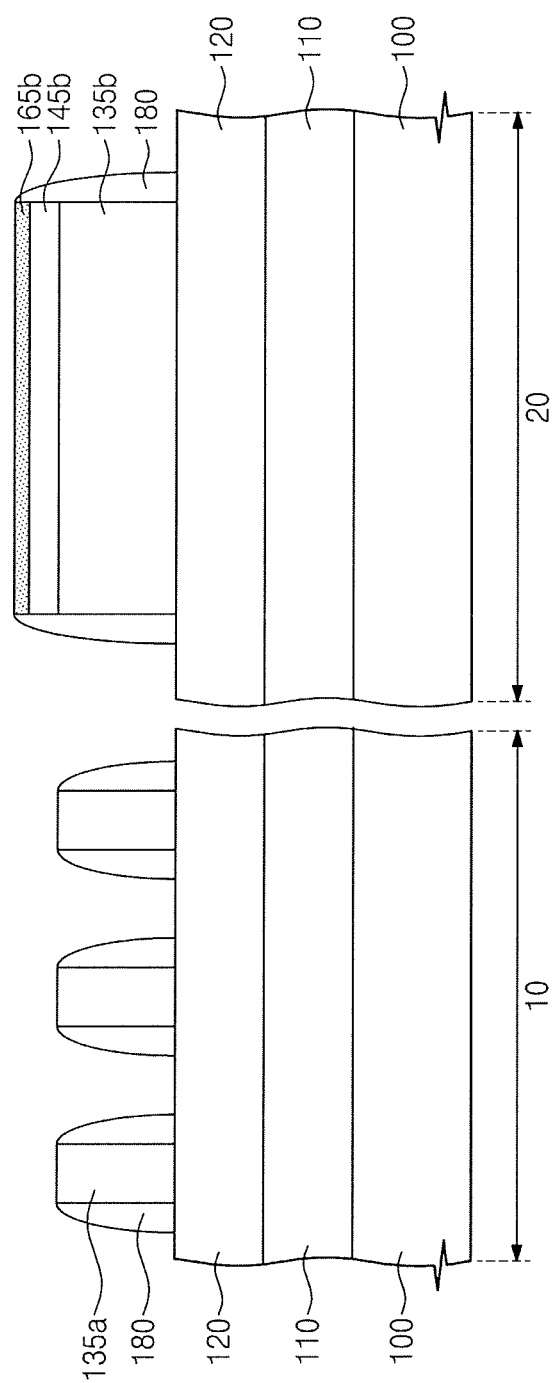

Referring to FIG. 1D, the spacer layer 185 may be etched to form spacers 180 that cover sidewalls of the first sacrificial pattern 135a of the first region 10 and sidewalls of the second sacrificial pattern 135b, the second lower anti-reflection pattern 145b and the second upper anti-reflection pattern 165b of the second region 20.

The first lower anti-reflection pattern 145a of the first region 10 may be removed by the etching process to expose a top surface of the first sacrificial pattern 135a of the first region 10. In addition, the second upper anti-reflection pattern 165b of the second region 20 may be partially etched, but the second lower anti-reflection pattern 145b may not be exposed. In other words, the spacers 180 of the second region 20 may expose a top surface of the second upper anti-reflection pattern 165b. Over-etching may be performed to form the spacers 180 disposed on the sidewalls of the patterns 135a, 145b and 165b. The first lower anti-reflection pattern 145a of the first region 10 may be removed during the etching process of forming the spacers 180, but the second upper anti-reflection pattern 165b of the second region 20 may remain to protect the second lower anti-reflection pattern 145b during the etching process since the second upper anti-reflection pattern 165b includes a material having an etch selectivity with respect to the spacer layer 185.

Figure 1E:
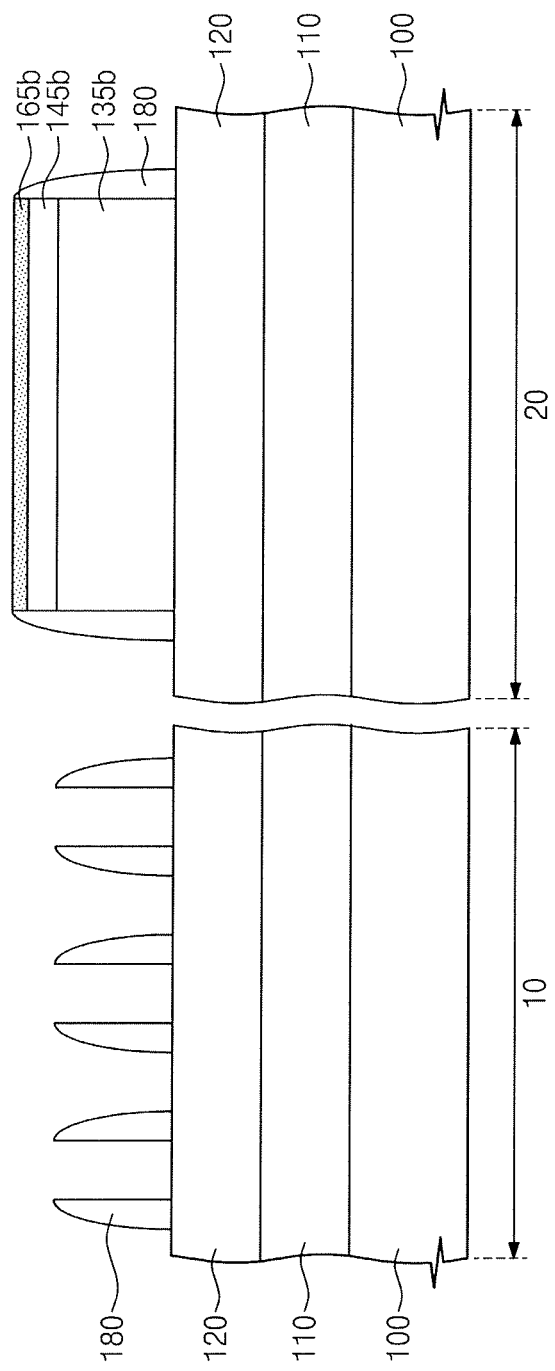

Referring to FIG. 1E, the first sacrificial pattern 135a of the first region 10 may be removed. The selective removal of the first sacrificial pattern 135a may be performed using an ashing process. The second sacrificial pattern 135b of the second region 20 may be protected by the spacers 180, the second lower anti-reflection pattern 145b, and the second upper anti-reflection pattern 165b. In other words, the second sacrificial pattern 135b of the second region 20 may not be removed. Thus, the second sacrificial pattern 135b, the second lower anti-reflection pattern 145b, and the second upper anti-reflection pattern 165b may remain on the second region 20.

Figure 1F:
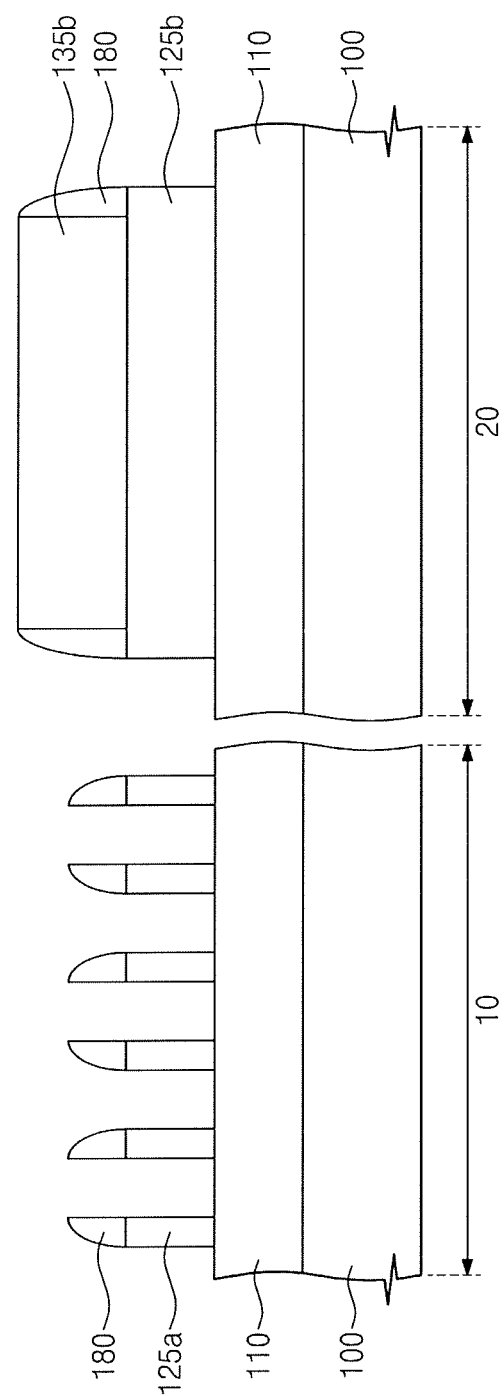

Referring to FIG. 1F, the upper mask layer 120 of the first region 10 may be etched using the spacers 180 of the first region 10 as etch masks to form first upper mask patterns 125a, and the upper mask layer 120 of the second region 20 may be etched using the spacers 180, the second sacrificial pattern 135b, the second lower anti-reflection pattern 145b, and the second upper anti-reflection pattern 165b of the second region 20 as etch masks to form a second upper mask pattern 125b. The first upper mask patterns 125a may expose portions of a top surface of the lower mask layer 110 of the first region 10, and the second upper mask pattern 125b may expose portions of a top surface of the lower mask layer 110 of the second region 20.

In an exemplary embodiment of the inventive concept, the second upper anti-reflection pattern 165b and the second lower anti-reflection pattern 145b of the second region 20 may be completely removed during the process of etching the upper mask layer 120. In addition, the second sacrificial pattern 135b of the second region 20 may be partially etched.

In an exemplary embodiment of the inventive concept, the second upper anti-reflection pattern 165b of the second region 20 may be completely removed during the process of etching the upper mask layer 120. However, a portion of the second lower anti-reflection pattern 145b may remain when etching the upper mask layer 120.

Figure 1G:
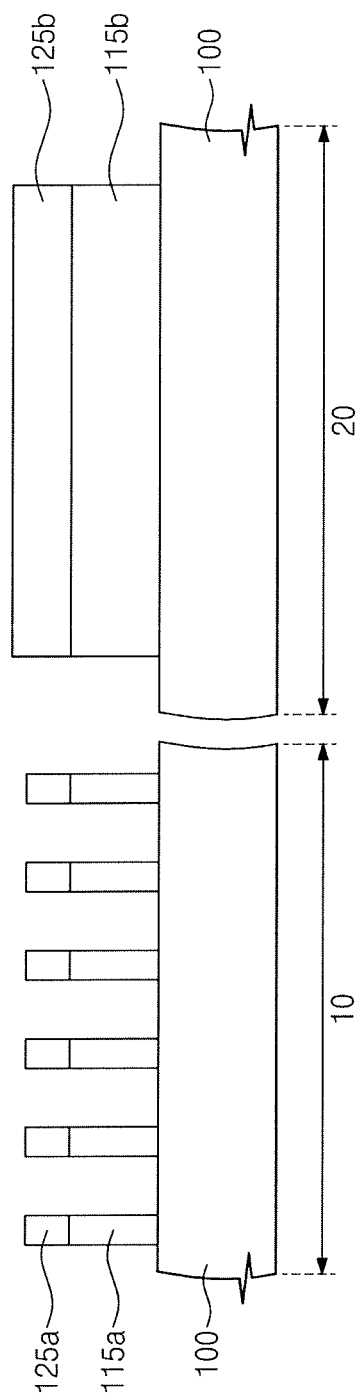

Referring to FIG. 1G, the lower mask layer 110 of the first region 10 may be etched using the first upper mask patterns 125a as etch masks to form first lower mask patterns 115a, and the lower mask layer 110 of the second region 20 may be etched using the second upper mask pattern 125b as an etch mask to form a second lower mask pattern 115b. The second sacrificial pattern 135b of the second region 20 and the spacers 180 may be removed during the formation of the first and second lower mask patterns 115a and 115b. The first and second upper mask patterns 125a and 125b may also be partially etched during the formation of the first and second lower mask patterns 115a and 115b. The first lower mask patterns 115a may expose portions of a top surface of the first region 10, and the second lower mask pattern 115b may expose portions of a top surface of the second region 20. In an exemplary embodiment of the inventive concept, the width of a first lower mask pattern 115a may be smaller than the width of a second lower mask pattern 115b.

Figure 1H:
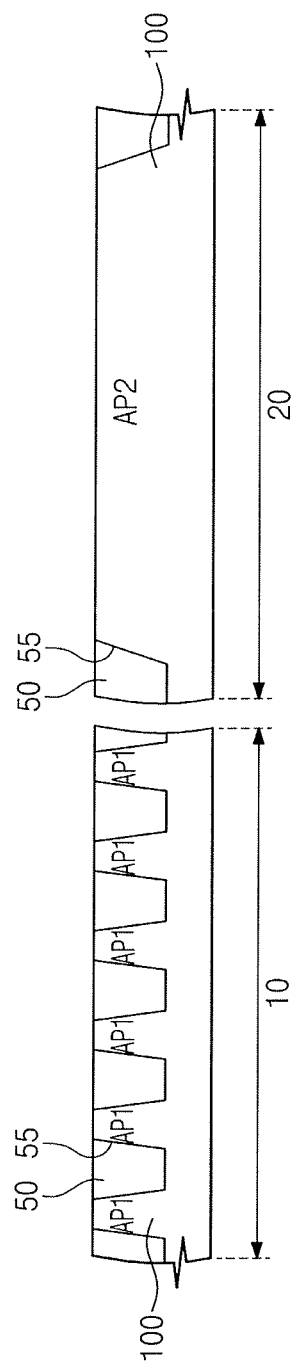

Referring to FIG. 1H, the semiconductor substrate 100 may be etched using the first and second lower mask patterns 115a and 115b as etch masks to form first active patterns AP1 of the first region 10 and a second active pattern AP2 of the second region 20. For example, the semiconductor substrate 100 may be etched using the first and second lower mask patterns 115a and 115b as etch masks to form trenches 55. In addition, device isolation layers 50 may be formed by filling the trenches 55 with an insulating material. The device isolation layers 50 may be formed in an upper portion of the semiconductor substrate 100. The active patterns AP1 and AP2 may be defined by the device isolation layers 50. For example, the device isolation layers 50 may include a silicon oxide ($SiO_2$) layer.

Memory cells of a highly integrated semiconductor memory device (e.g., a dynamic random access memory (DRAM) device, a static random access memory (SRAM) device, a phase change random access memory (PRAM) device, a resistance random access memory (RRAM) device, a magnetic random access memory (MRAM) device, or a ferroelectric random access memory (FRAM) device) may be formed on the first active patterns AP1 of the first region 10. Peripheral circuits controlling the memory cells may be formed on the second active pattern AP2 of the second region 20.

The anti-reflection layer 150 may have a single-layered structure formed of a silicon oxynitride (SiON) layer. The silicon oxynitride (SiON) layer may have an insufficient etch selectivity with respect to the spacers 180, wherein the spacers 180 include a silicon oxide ($SiO_2$) layer or a silicon nitride (SiN) layer. A portion of the anti-reflection layer 150 of the second region 20 may be removed to expose the sacrificial layer 130 during the formation of the spacers 180. If an aching process is performed thereafter, a portion of the sacrificial layer 130 of the second region 20 may be removed to cause a defect. If the sacrificial layer 130 having the defect is used as an etch mask, defects may occur in patterns to be formed in a subsequent process.

According to an exemplary embodiment of the inventive concept, the anti-reflection layer 150 may have a double-layered structure including the lower anti-reflection layer 140 and the upper anti-reflection layer 160. The upper anti-reflection layer 160 may include a material having an etch selectivity with respect to the spacers 180. The lower anti-reflection layer 140 may be used as an anti-reflection layer for a photolithography process. The second upper anti-reflection pattern 165b of the second region 20 may not be removed during the formation of the spacers 180. Thus, the second sacrificial pattern 135b may not be exposed. During the ashing process, the second upper anti-reflection pattern 165b may protect the second sacrificial pattern 135b. In other words, the second upper anti-reflection pattern 165b may not be removed during the ashing process. The second sacrificial pattern 135b of the second region 20 may be used as an etch mask in a subsequent process. Accordingly, the patterns to be formed in a subsequent process may not have defects.

FIGS. 2A to 2D are cross-sectional views illustrating a method for forming patterns of a semiconductor device, according to an exemplary embodiment of the inventive concept. FIG. 3 is an enlarged cross-sectional view of a region 'A' of FIG. 2A, according to an exemplary embodiment of the inventive concept. In the present embodiment, after the processes of FIGS. 2A to 2D, subsequent processes may be the same or similar as the processes described with reference to FIGS. 1F to 1H. Thus, a repetitive description of processes or elements described with reference to FIGS. 1F to 1H may be omitted for brevity.

Figure 2A:
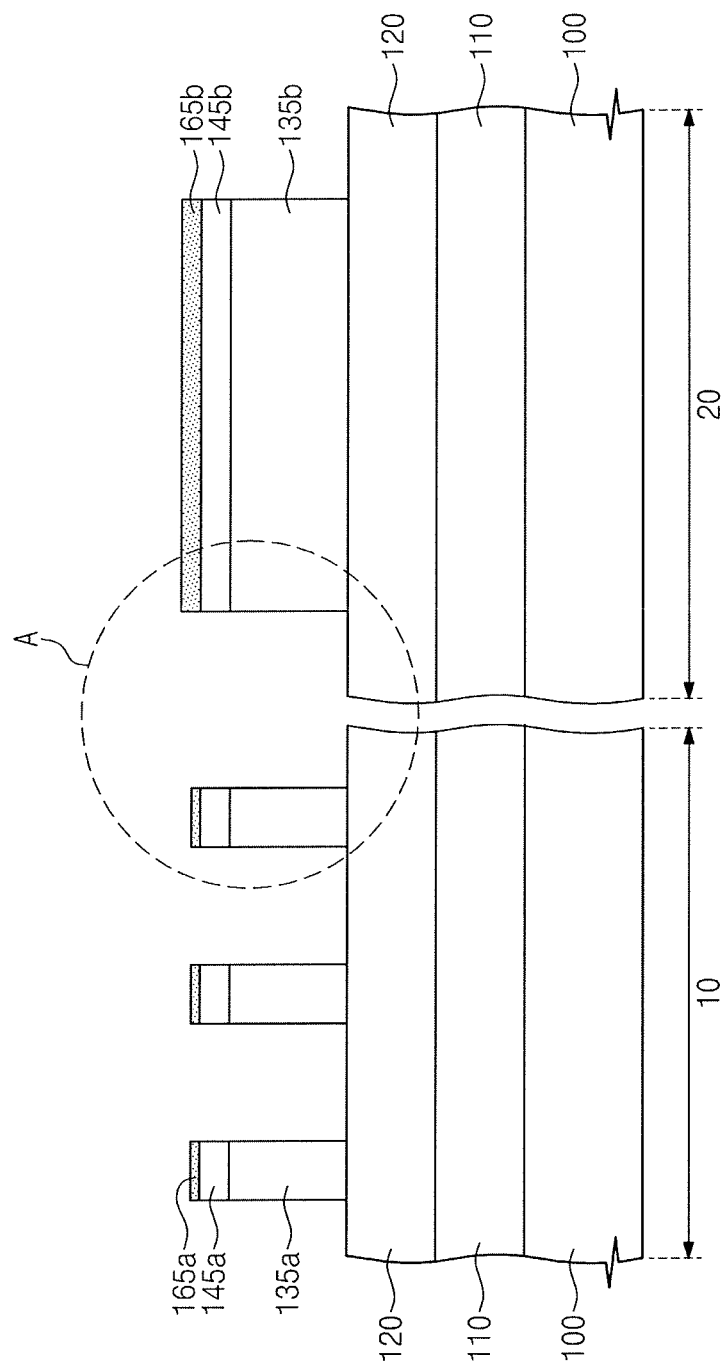
Figure 3:
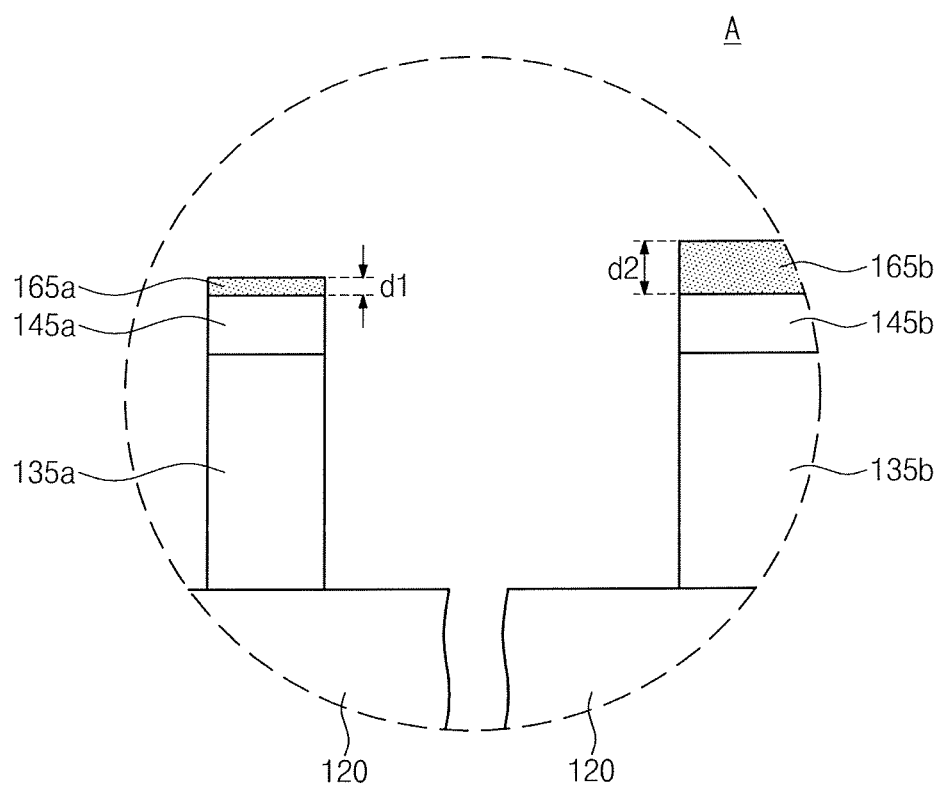
FIG. 3 is an enlarged cross-sectional view of a region 'A' of FIG. 2A, according to an exemplary embodiment of the inventive concept.

Referring to FIGS. 2A and 3, a patterning process may be performed on the structure of FIG. 1A to form a first sacrificial pattern 135a, a first lower anti-reflection pattern 145a, and a first upper anti-reflection pattern 165a on the first region 10, and to form a second sacrificial pattern 135b, a second lower anti-reflection pattern 145b, and a second upper anti-reflection pattern 165b on the second region 20.

The first upper anti-reflection pattern 165a of the first region 10 may have a first thickness d1, and the second upper anti-reflection pattern 165b of the second region 20 may have a second thickness d2. The first thickness d1 may be smaller than the second thickness d2. In the etching process of the patterning process, the first and second upper anti-reflection patterns 165a and 165b of the first and second regions 10 and 20 may be affected by an etching gas in a horizontal direction, a vertical direction and an inclined direction, the horizontal, vertical and inclined directions being taken with respect to top surfaces of the anti-reflection patterns 165a and 165b. Thus, the first and second upper anti-reflection patterns 165a and 165b may be etched in the horizontal direction, the vertical direction and the inclined direction. Since a width of the first upper anti-reflection pattern 165a is smaller than a width of the second upper anti-reflection pattern 165b, an etch rate of the first upper anti-reflection pattern 165a may be higher than an etch rate of the second upper anti-reflection pattern 165b. Thus, the thickness of a first upper anti-reflection pattern 165a may be smaller than the thickness of a second upper anti-reflection pattern 165b. In this case, a thickness of the first lower anti-reflection pattern 145a may be substantially equal to a thickness of the second lower anti-reflection pattern 145b.

Figure 2B:
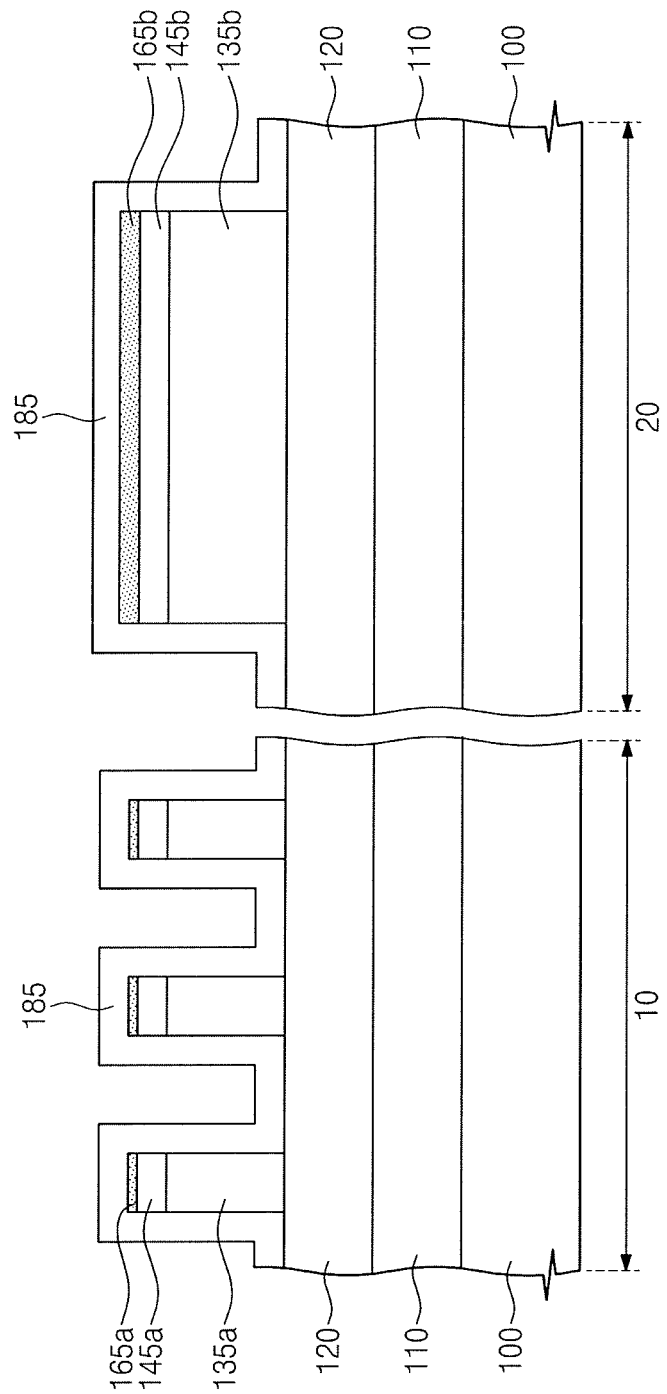

Referring to FIG. 2B, a spacer layer 185 may be formed to cover the first sacrificial pattern 135a, the first lower anti-reflection pattern 145a, the first upper anti-reflection pattern 165a, the second sacrificial pattern 135b, the second lower anti-reflection pattern 145b, and the second upper anti-reflection pattern 165b. The spacer layer 185 may have a uniform thickness on top surfaces and sidewalls of the first and second sacrificial patterns 135a and 135b, the first and second lower anti-reflection patterns 145a and 145b, and the first and second upper anti-reflection patterns 165a and 165b. The spacer layer 185 may have an etch selectivity with respect to the first and second sacrificial patterns 135a and 135b. In addition, the first and second upper anti-reflection patterns 165a and 165b may have an etch selectivity with respect to the spacer layer 185. The first and second lower anti-reflection patterns 145a and 145b may include a material of which an etch rate is equal or similar to that of the spacer layer 185. A material included in the first and second lower anti-reflection patterns 145a and 145b, a material included in the first and second upper anti-reflection patterns 165a and 165b, and a material included in the spacer layer 185 may be the same as the materials described with reference to FIG. 1C.

Figure 2C:
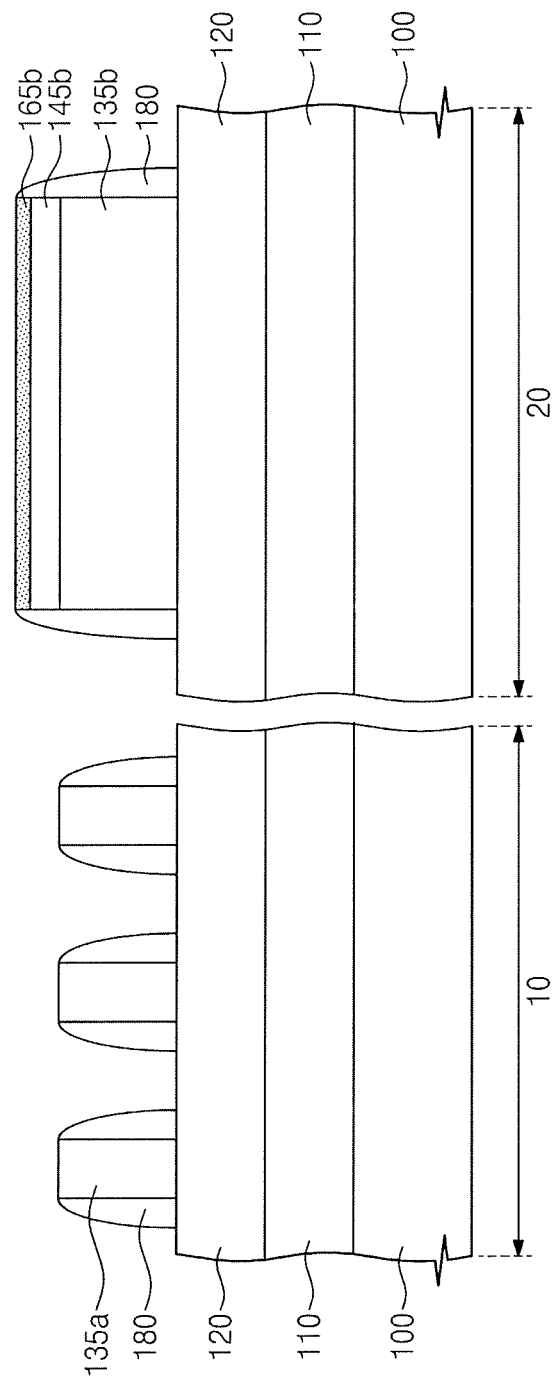

Referring to FIG. 2C, the spacer layer 185 may be etched to form spacers 180 covering sidewalls of the first sacrificial pattern 135a and sidewalls of the second sacrificial pattern 135b, sidewalls of the second lower anti-reflection pattern 145b and sidewalls of the second upper anti-reflection pattern 165b. The etching process may be performed until the first lower and upper anti-reflection patterns 145a and 165a of the first region 10 are removed to expose a top surface of the first sacrificial pattern 135a. The first upper anti-reflection pattern 165a may include the material having an etch selectivity with respect to the spacer layer 185. However, since the thickness of the first upper anti-reflection pattern 165a is small, the first upper anti-reflection pattern 165a may be completely removed during the process of etching the spacer layer 185.

Since the second upper anti-reflection pattern 165b has an etch selectivity with respect to the spacer layer 185, and the thickness of the second upper anti-reflection pattern 165b is greater than the thickness of the first upper anti-reflection pattern 165a, a portion of the second upper anti-reflection pattern 165b may remain after the process of etching the spacer layer 185.

Referring to FIG. 2D, an ashing process may be performed to remove the first sacrificial pattern 135a of the first region 10. The second sacrificial pattern 135b of the second region 20 may be protected by the spacers 180, the second lower anti-reflection pattern 145b, and the second upper anti-reflection pattern 165b. In other words, the second sacrificial pattern 135b of the second region 20 may not be removed. Thus, the second sacrificial pattern 135b, the second lower anti-reflection pattern 145b, and the second upper anti-reflection pattern 165b may remain on the second region 20.

According to an exemplary embodiment of the inventive concept, during the formation of the spacers 180, the first lower and upper anti-reflection patterns 145a and 165a of the first region 10 may be completely removed but the second upper anti-reflection pattern 165b of the second region 20 may remain on the second lower anti-reflection pattern 145b. Since the second upper anti-reflection pattern 165b has an etch selectivity with respect to the spacers 180 and is thicker than the first upper anti-reflection pattern 165a, the second upper anti-reflection pattern 165b of the second region 20 may act as an etch stop layer protecting the second sacrificial pattern 135b and the second lower anti-reflection pattern 145b during the process of forming the spacers 180.

According to an exemplary embodiment of the inventive concept, the anti-reflection layer 150, having an etch selectivity with respect to the spacers 180, may be used as an etch stop layer to form a hard mask pattern (e.g., the second upper mask pattern 125b and/or the second lower mask pattern 115b). The hard mask pattern may have an excellent reliability on a peripheral circuit region (e.g., the second region 20). A wide-width pattern may be formed on the peripheral circuit region by using the hard mask pattern as an etch mask.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for forming patterns of a semiconductor device, the method comprising:
   sequentially forming a hard mask layer, a sacrificial layer, and an anti-reflection layer on a substrate, the substrate including a cell region and a peripheral circuit region;
   patterning the sacrificial layer to form, a first sacrificial pattern on the cell region and a second sacrificial pattern on the peripheral circuit region;
   forming spacers covering sidewalls of the first and second sacrificial patterns; and
   removing the first sacrificial pattern,
   wherein the anti-reflection layer comprises:
   a lower anti-reflection layer and an upper anti-reflection layer which are formed of materials different from each other,
   wherein, in the patterning of the sacrificial layer, the anti-reflection layer is patterned, to form a first anti-reflection pattern on the first sacrificial pattern and a second anti-reflection pattern on the second sacrificial pattern, and
   wherein the second anti-reflection pattern, remains when the first sacrificial pattern is removed,
   wherein the spacers and the lower anti-reflection layer include silicon oxide or a nitride, and
   when the spacers and the lower anti-reflection layer include silicon oxide, the upper anti-reflection layer includes silicon nitride, boron nitride, or titanium nitride, and when the spacers and the lower anti-reflection layer include a nitride, the upper anti-reflection layer includes silicon oxide.

2. The method of claim 1, wherein an etch rate of the upper, anti-reflection layer is lower than an etch rate of the spacers.

3. The method of claim 1, wherein the first anti-reflection pattern comprises a first lower anti-reflection pattern formed by patterning the lower anti-reflection layer, and
   wherein the second anti-reflection pattern comprises:
   a second lower anti-reflection pattern formed by patterning the lower anti-reflection layer; and
   an upper anti-reflection pattern formed by patterning the upper anti-reflection layer.

4. The method of claim 3, wherein the first lower anti-reflection pattern is removed when the spacers are formed.

5. The method of claim 1, wherein the first anti-reflection pattern comprises:
   a first lower anti-reflection pattern formed by patterning the lower anti-reflection layer; and
   a first upper anti-reflection pattern formed by patterning the upper anti-reflection layer, and
   wherein the second anti-reflection pattern comprises:
   a second lower anti-reflection pattern formed by patterning the lower anti-reflection layer; and
   a second upper anti-reflection pattern formed by patterning the upper anti-reflection layer.

6. The method of claim 1, wherein a width of the second sacrificial pattern of the peripheral circuit region is greater than a width of the first sacrificial pattern of the cell region.

7. The method of claim 1, further comprising:
   etching the hard mask layer using the spacers of the cell region as etch masks to form first hard mask patterns; and
   etching the hard mask layer using the second sacrificial pattern and the spacers of the peripheral circuit region as etch masks to form a second hard mask pattern.

8. A method for forming patterns of a semiconductor device, the method comprising:
   sequentially forming a hard mask layer, a sacrificial layer, an anti-reflection layer, and a protection layer on a substrate, the substrate including a cell region and a peripheral circuit region;
   patterning the anti-reflection layer and the sacrificial layer to form a first sacrificial pattern and a first anti-reflection pattern on the cell region and to form a second sacrificial pattern and a second anti-reflection pattern on the peripheral circuit region;
   forming spacers covering sidewalk of the first and second sacrificial patterns;
   removing the first sacrificial pattern;
   etching the hard mask layer using the spacers of the cell region as etch masks to form first hard mask patterns; and
   etching the hard mask layer using the second sacrificial pattern and the spacers of the peripheral circuit region as etch masks to form a second hard mask pattern,
   wherein the protection layer is etched to form a first protection pattern on the second anti-reflection pattern during the patterning of the anti-reflection layer and the sacrificial layer,
   wherein the first protection pattern remains when the first sacrificial pattern is removed,
   wherein the anti-reflection layer and the protection layer overlap each other,
   wherein the spacers include silicon oxide,
   wherein the anti-reflection layer includes $SiO_xN_{1-x}$,
   wherein the protection layer is $SiO_{1-y}N_y$, and wherein "x" is equal to or greater than 0.9 and less than 1, and "y" is equal to or greater than 0.9 and less than 1.

9. The method of claim 8, wherein a rate by which the protection layer is etched is greater than a rate by which the spacers are etched.

10. The method of claim 8, wherein the protection layer is etched to form a second protection pattern on the first anti-reflection pattern when the anti-reflection layer and the sacrificial layer are patterned,
wherein the second protection pattern has a first thickness, and
wherein the first protection pattern has a second thickness greater than the first thickness.

11. The method of claim 10, wherein the first anti-reflection pattern and the second protection pattern are removed when the spacers are formed.

12. A method for forming patterns of a semiconductor device, the method comprising:
sequentially forming a first hard mask layer, a sacrificial layer, a lower anti-reflection layer and an upper anti-reflection layer on a substrate, the substrate including a cell region and a peripheral circuit region;
patterning the sacrificial layer and the lower and upper anti-reflection layers to form a first sacrificial pattern on the cell region and a second sacrificial pattern on the peripheral circuit region, wherein, when patterning the sacrificial layer and the lower and upper anti-reflection layers, the upper anti-reflection layer is etched by a first degree in the cell region, and the upper anti-reflection layer is etched by a second degree, smaller than the first degree, in the peripheral circuit region to remain in the peripheral circuit region;
forming a pair of first spacers on opposing sidewalls of the first sacrificial pattern and a pair of second spacers on opposing sidewalls of the second sacrificial pattern;
removing the first sacrificial pattern; and
patterning the first hard mask layer using the pair of first spacers, the pair of second spacers and the second sacrificial pattern to form a first mask pattern on the cell region and a second mask pattern on the peripheral circuit region,
wherein at least one spacer of the pair of first spacers or the pair of second spacers includes a nitride,
wherein the lower anti-reflection layer includes $SiO_{1-z}N_z$,
wherein the upper anti-reflection layer includes $SiO_wN_{1-w}$, and
wherein "z" is equal to or greater than 0.9 and less than 1, and "w" is equal to or greater than 0.9 and less than 1.

13. The method of claim 12, wherein, when patterning the sacrificial layer and the lower and upper anti-reflection layers, the upper anti-reflection layer remains in the cell region, and
wherein the upper anti-reflection layer that remains in the cell region has a smaller thickness than the upper anti-reflection layer that remains in the peripheral circuit region.

14. The method of claim 12, wherein, when patterning the sacrificial layer and the lower and upper anti-reflection layers, the upper anti-reflection layer is removed from the cell region.

15. The method of claim 12, further comprising forming a second hard mask layer between the substrate and the first hard mask layer; and
patterning the second hard mask layer using the first and second mask patterns as etch masks to form a third mask pattern on the cell region and a fourth mask pattern on the peripheral circuit region, the third mask pattern having a smaller width than the fourth mask pattern.

16. The method of claim 15, further comprising etching the substrate using the third mask pattern as an etch mask to form a first active pattern in the cell region; and
etching the substrate using the fourth mask pattern as an etch mask to form a second active pattern in the peripheral circuit region, the first active pattern having a smaller width than the second active pattern.

* * * * *